United States Patent
Weber

[19]

[11] Patent Number: 6,034,560
[45] Date of Patent: Mar. 7, 2000

[54] DIGITAL PULSE GENERATOR

[75] Inventor: Mark E. Weber, Hawthorne, Calif.

[73] Assignee: TRW Inc., Redondo Beach, Calif.

[21] Appl. No.: 09/069,272

[22] Filed: Apr. 29, 1998

[51] Int. Cl.[7] .................................................. G06F 1/04
[52] U.S. Cl. .......................... 327/291; 327/298; 327/172
[58] Field of Search ................................... 327/291, 298, 327/299, 172, 176

[56] References Cited

U.S. PATENT DOCUMENTS 4,984,223  1/1991  Cho et al. .................................. 368/76

Primary Examiner—Timothy P. Callahan
Assistant Examiner—An T. Luu
Attorney, Agent, or Firm—Michael S. Yatsko

[57] ABSTRACT

A digital pulse generator having a high-speed clock (22) and two clock pulse counters (10 and 12), one (10) to time the start of each pulse and one (12) to time the pulsewidth, based on clock counts supplied from a microcontroller (14) to which a user inputs desired pulse parameters. The combination of the high-speed clock (22) and the clock pulse counters (10 and 12) produces precise and reliable output pulses for a variety of applications, and at a relatively low cost. Operation may be selected to be in internal mode, in which successive pulses are produced at a desired period, or an external mode, in which a pulse is generated after a selected time delay. A trigger signal input circuit (48, 32) and a trigger signal output circuit (42), both with adjustable impedances, facilitate interconnection of multiple digital pulse generators as needed for a given application.

5 Claims, 1 Drawing Sheet

DIGITAL PULSE GENERATOR

BACKGROUND OF THE INVENTION

This invention relates generally to pulse generators and, more particularly, to pulse generators that are easily programmable for a wide variety of applications. Pulse generators are used in many different fields but there is a special need in the field of solid-state laser development and testing, for a pulse generator that can supply precise low jitter waveforms to trigger diode laser amplifiers. The pulse generator should be capable of running asynchronously from an internal source or initiated by an external trigger signal. It should, of course, also be capable of operation in either single-shot or continuous mode, and should have a wide dynamic range of programmable pulsewidths, pulse periods, and delay times following a trigger signal. Ideally, the pulse generator should be capable of driving multiple laser pulses from a selectable-impedance output and should have the ability to disable its pulse output manually if desired.

Commercial pulse generators prior to this invention have been physically large, expensive, and limited in capability and adaptability. Typical commercial pulse generators have used analog techniques, which introduce proportionally larger pulse delay jitter for longer pulse delays. Accordingly, there is still a need for a digital pulse generator that overcomes the shortcomings of the prior art and meets the requirements summarized above. The present invention satisfies this need.

SUMMARY OF THE INVENTION

The present invention resides in a digital pulse generator. Briefly, and in general terms, the digital pulse generator of the invention comprises a user interface allowing selection of an internal or an external mode of operation, and selection of pulse parameters, including a pulsewidth, pulse period for internal mode operation and pulse delay for external mode of operation; a high-frequency clock for generating clock signals; a microcontroller coupled to the user interface, for conversion of the selected pulse parameters to equivalent numbers of clock signals; a pulse period/delay generator; and a pulsewidth generator. The pulse period/delay generator provides a pulse start signal when the selected pulse period or delay has elapsed. The pulse period/delay generator receives clock signals from the high-frequency clock and includes a counter to count a number of the clock signals equivalent to the selected pulse period in internal mode or the pulse delay in external mode. The pulsewidth generator provides a pulse stop signal when the selected pulsewidth time has elapsed after the start of the pulse. The pulsewidth generator receives clock signals from the high-frequency clock and includes a clock to count a number of clock signals equivalent to the selected pulsewidth.

The digital pulse generator may also include an external trigger signal input circuit, to facilitate generation of at least one pulse triggered by an external signal. The device may further include a trigger synchronization output signal circuit, to provide an output synchronization signal for coupling to at least one additional digital signal generator. Other useful features include a pulse output driver circuit providing a selection of output impedance. The trigger synchronization output signal circuit also provides a selection of output impedances. Optionally, the pulse driver output circuit and the trigger synchronization output signal circuit have separate output disable circuits permitting selective suppression of the output signals.

It will be appreciated from this summary that the present invention represents a significant advance in the field of pulse generators. In particular, the digital pulse generator of the invention provides precisely timed output pulses in either an internal or an external mode of operation. The output pulses are virtually jitter free and the pulse width and the pulse period or delay may be easily selected with a user interface and associated microcontroller. Trigger signal input and output circuits facilitate coupling of multiple pulse generators in cascade or in parallel configurations. Other aspects and advantages of the invention will become apparent from the following more detailed description, taken in conjunction with the accompanying drawing.

DESCRIPTION OF THE PREFERRED EMBODIMENT

Figure 1:
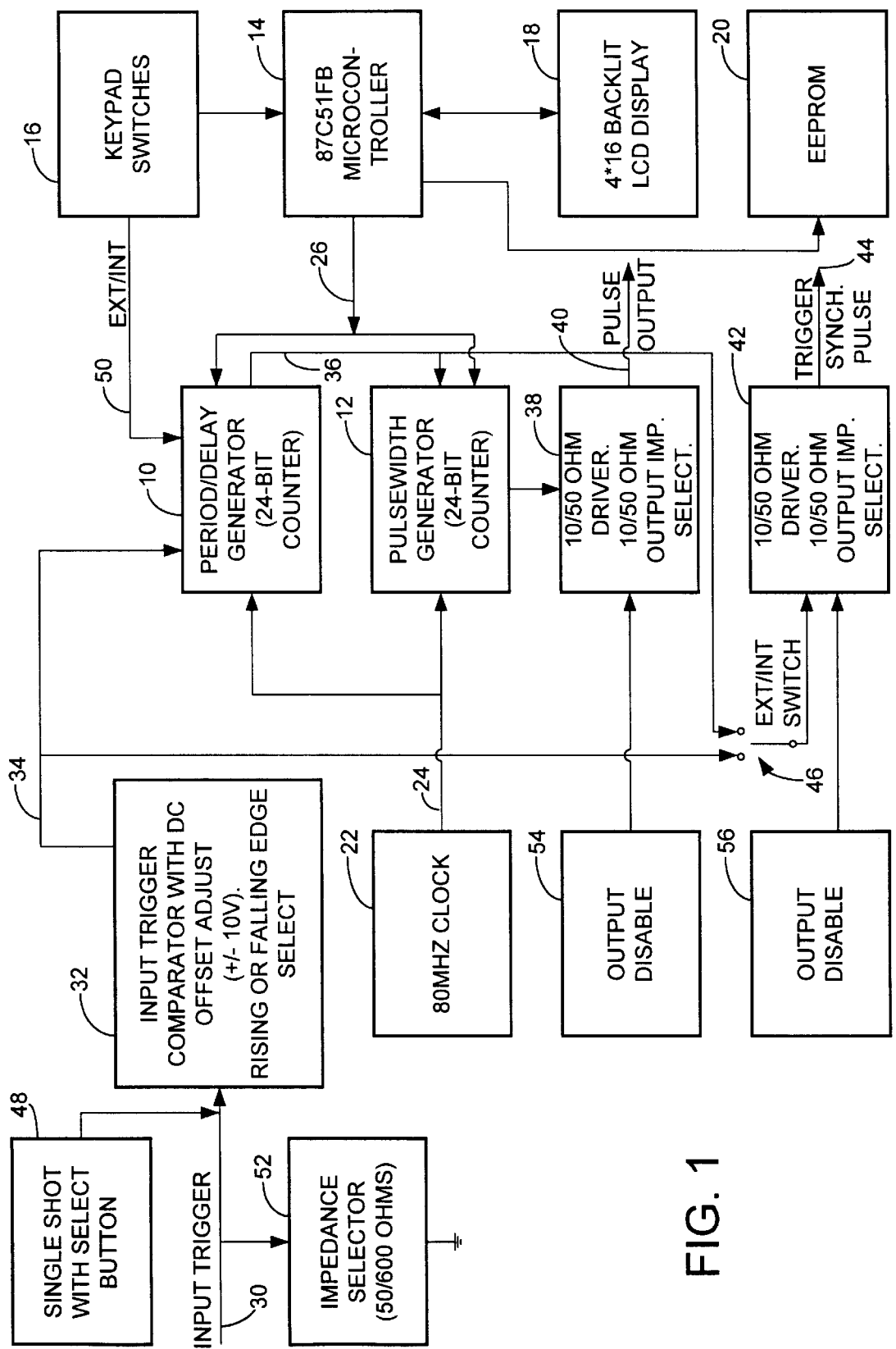
FIG. 1 is a block diagram of a digital pulse generator in accordance with the present invention.

As shown in the drawing, the present invention pertains to a digital pulse generator that is easily programmable to meet the requirements of a variety of applications. The pulse generator of the invention was designed for use in solid-state laser development and testing activities, which require precise pulse waveforms having low "jitter." Jitter is a term of art used to refer to any small, rapid variations in a waveform due to fluctuations in voltage or other parameters. In laser testing, it is often a requirement to provide pulses that are selectable in width and delay to a resolution of 100 nanoseconds (secondsH$10^{-9}$).

FIG. 1 shows the digital pulse generator of the present invention in block diagram form. A central feature of the pulse generator of the invention is a combination of a pulse period or delay generator, indicated by reference numeral 10, and a pulsewidth generator 12, each of which includes a 24-bit counter implemented as a field programmable gate array (FPGA). The generators 10 and 12 are controlled by a microcontroller 14, such as one sold under part number 87C51FB, a widely used microcontroller chip manufactured by Intel Corporation and others. The microcontroller 14 has an associated keyboard or control switches 16, a display 18, such as a 4×16 back-lit liquid crystal diode (LCD) display, and an electronically erasable programmable read-only memory (EEPROM) 20. An 80-MHz (megahertz) crystal clock 22 provides clock pulses to the generators 10 and 12, over line 24. The pulse period or delay generator 10 functions by counting clock pulses received from the clock 22. The number of clock pulses to be counted count is computed by the microcontroller 14 and transmitted as count data over line 26 to the pulse period or delay generator 10. The count is calculated based on information received from a user through the keyboard or switches 16.

The pulsewidth generator 12 functions in much the same way as the pulse period or delay generator 10, receiving count data over line 26 from the microcontroller 14 and counting clock pulses received over line 24 from the clock 22.

The digital pulse generator of the invention is operable in either of two modes, internal or external, at the user's selection. In internal mode, the pulse period or delay generator 10 times the pulse period, from the start of one pulse to the start of the next pulse. The pulsewidth is determined by the pulsewidth generator 12. In internal mode, the pulse generator produces a sequence of periodic pulses, the width of which is determined by the pulsewidth generator 12, under control of the microcontroller 14, and the period of which is determined by the pulse period or delay generator 10, also under control of the microcontroller. In external mode, pulse timing is initiated by an external source, which generates a trigger signal applied to the pulse generator over an input trigger line 30 to an input trigger comparator circuit 32, which generates a "start" signal on line 34 to the period/delay generator 10. The pulse period or delay generator 10 then functions as a delay timer, initiating the start of a pulse after a selected delay time following the occurrence of the externally generated trigger signal. A pulse start signal is generated after the delay time has elapsed, on line 36 from the period/delay generator 10 to the pulsewidth generator 12.

The pulsewidth generator 12 starts outputting a pulse on receipt of the pulse start signal on line 36 and continues to output the pulse until the pulsewidth generator 12 has counted down its counter to determine the pulsewidth. Output from the pulsewidth generator 12 is passed to an output driver circuit 38, which is selectable to operate at either of two standard output impedances, 10 ohms and 50 ohms. The output driver circuit 38 transmits the output pulse on output line 40.

A similar output driver circuit 42 generates an output trigger synchronization pulse on output line 44. The source of this output trigger synchronization pulse depends on whether the pulse generator is in internal or external mode. The output trigger pulse is derived from a single-pole switch 46, one input of which is connected to the input trigger line 34 from the input trigger comparator circuit 32, and the other input of which is connected to output line 36 from the period/delay generator 10. When the switch 46 is in the external mode position, the input trigger signal on line 34 results in an output pulse on trigger synchronization pulse line 44. When the switch 46 is in the internal mode position, the pulse start signal on line 36 is coupled to the trigger synchronization pulse line 44.

In internal mode, the period/delay generator 10 generates pulse start signals on line 36 periodically. As indicated in block 48, a select button allows the user to initiate internal-mode operation. This triggers operation of the period/delay generator 10, to generate periodic pulse start signals on line 36. A line 50 from the keypad switches 16, or from the microcontroller 14, conditions the period/delay generator to operate either in the internal or in the external mode. In external mode, the period/delay generator 10 produces only one pulse start signal on line 36, after the selected delay time has elapsed, with the initial pulse start signal being triggered by an external signal on line 34 from the input trigger comparator circuit 32.

The input trigger line 30 and the output trigger synchronization pulse line 44 allow multiple pulse generators to be connected in a cascade arrangement or in other configurations. For example, a trigger synchronization pulse can be used to initiate operation of multiple pulse generators in parallel. The input trigger line 30 has an associated impedance selector 52 to facilitate connection to an input line of selected impedance, such as 50 ohms or 600 ohms. The input trigger comparator circuit 32 identifies the input trigger signal and allows for adjustment of the signal with a selected DC voltage offset. The input comparator circuit 32 also has the ability to select triggering on either a rising edge or a falling edge of the input trigger signal. The output drivers 38 and 42 have respective output disable circuits 54 and 56, which are useful in some applications of the pulse generator.

It will be understood from the foregoing description that the pulse generator of the present invention may be easily switched to different configurations and connected with similar other pulse generators in cascaded and parallel arrangements. The two digital counters in the period/delay generator 10 and the pulsewidth generator 12 provide for reliable, precise and easily adjustable generation of pulses in a selected mode of operation, but without the need for costly components. It will also be understood that, although the invention has been described in detail for purposes of illustration, various modifications may be made without departing from the spirit or scope of the invention, which should not be limited except as by the appended claims.

What is claimed is:

1. A digital pulse generator, comprising:
   a user interface allowing selection of an internal or an external mode of operation, and selection of pulse parameters, including a pulsewidth, pulse period for internal mode operation and pulse delay for external mode of operation;
   a high-frequency clock for generating clock signals at a fixed frequency;
   a microcontroller coupled to the user interface, for conversion of each selected pulse parameter to a clock signal count at the fixed clock frequency;
   a pulse period/delay generator, for generating a pulse start signal when a selected pulse period or delay has elapsed, wherein the pulse period/delay generator receives clock signals from the high-frequency clock and includes a counter to count the clock signals up to a count provided by the microcontroller and derived from the selected pulse period in internal mode or pulse delay in external mode, wherein the pulse start signal is generated when the counter reaches the count provided by the microcontroller; and
   a pulsewidth generator, for generating a pulse stop signal when a selected pulsewidth time has elapsed, wherein the pulsewidth generator receives clock signals from the high-frequency clock and includes another counter, to count clock signals up to another count provided by the microcontroller and derived from the selected pulsewidth, wherein the pulse stop signal is generated when the second counter reaches the count derived from the selected pulsewidth.

2. A digital pulse generator as defined in claim 1, and further comprising an external trigger signal input circuit, coupled to the pulse period/delay generator to facilitate generation of at least one pulse triggered by an external signal.

3. A digital pulse generator as defined in claim 2, and further comprising a trigger synchronization output signal circuit, to provide an output synchronization signal for coupling to at least one additional digital signal generator.

4. A digital signal generator as defined in claim 3, and further comprising:
   a pulse output driver circuit providing a selection of output impedance;
   and wherein the trigger synchronization output signal circuit also provides a selection of output impedances.

5. A digital signal generator as defined in claim 4, wherein:
   the pulse driver output circuit and the trigger synchronization output signal circuit each has an output disable circuit permitting selective suppression of output signals.

* * * * *